United States Patent
Kang

(10) Patent No.: US 8,854,903 B2
(45) Date of Patent: Oct. 7, 2014

(54) DATA ALIGNMENT CIRCUIT

(75) Inventor: Tae Jin Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 389 days.

(21) Appl. No.: 13/356,977

(22) Filed: Jan. 24, 2012

(65) Prior Publication Data

US 2012/0195134 A1    Aug. 2, 2012

(30) Foreign Application Priority Data

Jan. 28, 2011  (KR) .................. 10-2011-0008846

(51) Int. Cl.
*G11C 7/10*    (2006.01)
(52) U.S. Cl.
CPC ............ *G11C 7/1012* (2013.01); *G11C 7/1087* (2013.01); *G11C 7/1072* (2013.01)
USPC ................... 365/189.17; 365/189.15
(58) Field of Classification Search
USPC ................ 365/189.15, 189.17, 189.05, 193
See application file for complete search history.

(56) References Cited

U.S. PATENT DOCUMENTS

| | | | | |
|---|---|---|---|---|
| 6,639,868 | B2* | 10/2003 | Kim et al. | 365/233.12 |
| 2004/0240302 | A1* | 12/2004 | Park | 365/230.06 |
| 2006/0245278 | A1* | 11/2006 | Lee et al. | 365/193 |
| 2007/0014164 | A1* | 1/2007 | Lee | 365/193 |
| 2008/0137462 | A1 | 6/2008 | Faue et al. | |
| 2009/0115480 | A1* | 5/2009 | Jang et al. | 327/175 |
| 2011/0128049 | A1* | 6/2011 | Kang | 327/108 |

FOREIGN PATENT DOCUMENTS

| | | | |
|---|---|---|---|
| KR | 1020050031679 A | 4/2005 | |
| KR | 1020050065269 A | 6/2005 | |
| KR | 1020090067797 A | 6/2009 | |

* cited by examiner

*Primary Examiner* — Douglas King
(74) *Attorney, Agent, or Firm* — William Park & Associates Patent Ltd.

(57) ABSTRACT

A data alignment circuit includes: a select transmission unit configured to selectively transmit a first pulse or ground voltage as a first control pulse and selectively transmit a second pulse or ground voltage as a second control pulse, in response to a control signal; and a data latch unit configured to latch data in response to the first and second pulses and the first and second control pulses, and generate first to fourth data.

6 Claims, 5 Drawing Sheets

DATA ALIGNMENT CIRCUIT

CROSS-REFERENCES TO RELATED APPLICATIONS

The present application claims priority under 35 U.S.C 119(a) to Korean Application No. 10-2011-0008846, filed on Jan. 28, 2011, in the Korean intellectual property Office, which is incorporated herein by reference in its entirety.

BACKGROUND

In general, a semiconductor memory device accesses data in synchronization with a clock signal provided from a circuit that is located outside the memory device. A Double Data Rate (DDR) semiconductor memory device receives data in synchronization with the rising and falling edges of a clock signal inputted from a circuit or a memory controller located outside the DDR memory device. In a DDR semiconductor memory device, serial data received through a data pad are inputted as parallel data so as to store the aligned data in the memory cells by the unit of two bits. Furthermore, a Double Data Rate 2 (DDR2) semiconductor memory device utilizes a clock speed with twice the frequency of a clock signal used in a DDR semiconductor memory device in receiving data. In a DDR2 semiconductor memory device, serial data received through a data pad are inputted as parallel data so as to store the aligned data in the memory cells by the unit of four bits.

A combo semiconductor memory device is designed to support the DDR or DDR2 mode, and one of the two modes is selected through a metal option process during a manufacturing process. That is, in a combo semiconductor memory device, the number of bits of the data aligned in parallel is controlled using a metal option. And the speed of inputting or outputting a data in the DDR2 mode is twice as fast as that in the DDR mode.

The metal option refers to an option for sputtering a specific portion of a metal line used as an interconnection such that the specific portion operates like a switch. When such a metal option is used to control the bit number of data aligned in parallel, a mask used in the DDR mode and a mask used in the DDR2 mode should be manufactured separately.

SUMMARY

An embodiment of the present invention relates to a data alignment circuit capable of aligning serially-inputted data in a parallel form of two or four bits in response to a control signal.

In one embodiment, a data alignment circuit includes: a select transmission unit configured to selectively transmit a first pulse or ground voltage as a first control pulse and selectively transmit a second pulse or ground voltage as a second control pulse, in response to a control signal; and a data latch unit configured to latch data in response to the first and second pulses and the first and second control pulses, and generate first to fourth data.

In another embodiment, a data alignment circuit includes: a select transmission unit configured to transmit first and second pulses as first and second control pulses in a first mode, and transmit a ground voltage as the first and second control pulses in a second mode; and a data latch unit configured to latch data in response to the first and second pulses and the first and second control pulses, and generate first to fourth output data.

In still another embodiment, a method of aligning data in a semiconductor memory device includes: receiving serially inputted data; and aligning the serially inputted data into one of a first or second parallel form based on a control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
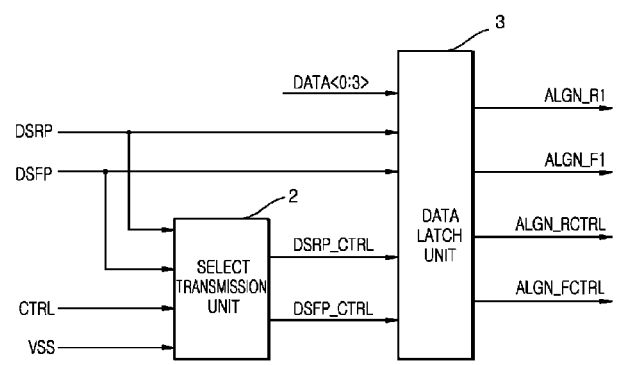
FIG. 1 is a block diagram of a data alignment circuit in accordance with an embodiment of the present invention.

FIG. 1 is a block diagram of a data alignment circuit in accordance with an embodiment of the present invention.

Referring to FIG. 1, the data alignment circuit in accordance with an embodiment of the present invention includes a select transmission unit 2 and a data latch unit 3.

The select transmission unit 2 as summarized in Table 1 is configured to transmit a first pulse DSRP as a first control pulse DSRP_CTRL and transmit a second pulse DSFP as a second control pulse DSFP_CTRL when a control signal CTRL is at a predetermined state (e.g., a logical low level). Furthermore, the select transmission unit 2 is configured to transmit a ground voltage VSS as the first and second control pulses DSRP_CTRL and DSFP_CTRL when the control signal CTRL is at another predetermined state (e.g., a logical high level).

The data latch unit 3 is configured to latch data DATA<0:3> and generate first output data ALGN_R1, second output data ALGN_F1, third output data ALGN_RCTRL, and fourth output data ALGN_FCTRL, in synchronization with the first pulse DSRP, the second pulse DSFP, the first control pulse DSRP_CTRL, and the second control pulse DSFP_CTRL. The control signal CTRL is inputted from a data pad. The control signal CTRL at a logical low level corresponds to a DDR2 mode. In the DDR2 mode the data DATA<0:3> are latched in a parallel form of four bits, and a case in which the control signal CTRL is at a logical high level corresponds to a DDR mode in which the data DATA<0:3> are latched in a parallel form of two bits. Furthermore, the first pulse DSRP includes a pulse which is generated in synchronization with a rising edge of a data strobe signal, and the second pulse DSFP includes a pulse which is generated in synchronization with a falling edge of the data strobe signal.

|  |  | Outputted by select transmission unit 2 | Outputted by data latch unit 3 |
|---|---|---|---|
| CTRL Low (DDR2) | 1st pulse DSRP (rising edge of the data strobe signal) | N/A | first output data ALGN_R1 |
|  | 2d pulse DSFP (falling edge of the data | N/A | second output data ALGN_F1 |

|  | | Outputted by select transmission unit 2 | Outputted by data latch unit 3 |
|---|---|---|---|
| | strobe signal) | | |
| | 1st pulse DSRP | 1st ctrl pulse DSRP_CTRL | third output data ALGN_RCTRL |
| | 2d pulse DSFP | 2nd ctrl pulse DSFP_CRTL | fourth output data ALGN_FCTRL |
| CTRL High (DDR) | 1st pulse DSRP | N/A | first output data ALGN_R1 |
| | 2d pulse DSFP | N/A | second output data ALGN_F1 |
| | 1st pulse DSRP | VSS | N/A |
| | 2d pulse DSFP | VSS | N/A |

Figure 2A:
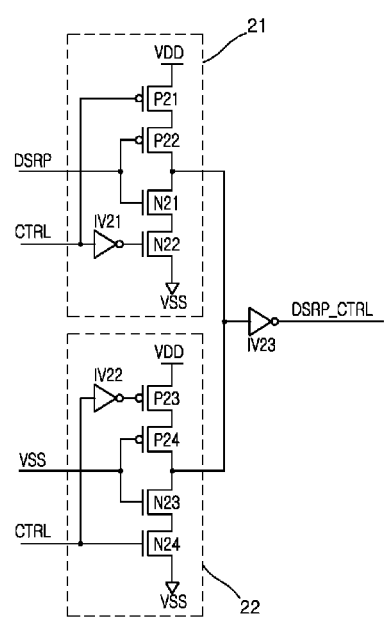
FIGS. 2A and 2B are circuit diagrams illustrating an example of a select transmission unit of FIG. 1
Figure 2B:
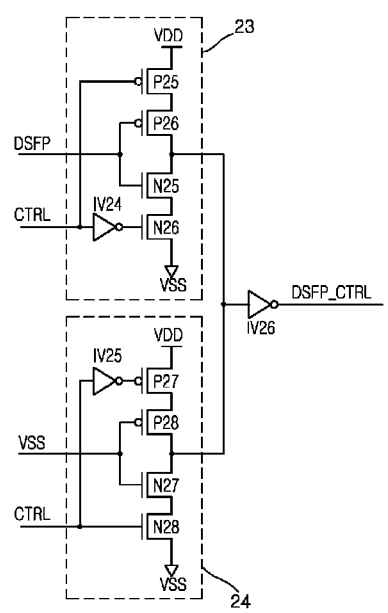

FIGS. 2A and 2B relate to circuit diagrams illustrating an example of the select transmission unit 2 of FIG. 1.

Referring to FIGS. 2A and 2B, the select transmission unit 2 includes first to fourth buffer sections 21 to 24.

The first buffer section 21 includes PMOS transistors P21 and P22, NMOS transistors N21 and N22, and an inverter IV21 configured to invert and buffer the control signal CTRL, and the first buffer section 21 is configured to invert and buffer the first pulse DSRP when the control signal CTRL is at a logical low level.

The second buffer section 22 includes PMOS transistors P23 and P24, NMOS transistors N23 and N24, and an inverter IV22 configured to invert and buffer the control signal CTRL, and the second buffer section 22 is configured to invert and buffer a ground voltage VSS when the control signal CTRL is at a logical high level.

An output signal of the first buffer section 21 and an output signal of the second buffer section 22 are inverted and buffered by an inverter IV23, and transmitted as the first control pulse DSRP_CTRL.

The third buffer section 23 includes PMOS transistors P25 and P26, NMOS transistor N25 and N26, and an inverter IV24 configured to invert and buffer the control signal CTRL, and the third buffer section 23 is configured to invert and buffer the second pulse DSFP when the control signal CTRL is at a logical low level.

The fourth buffer section 24 includes PMOS transistors P27 and P28, NMOS transistors N27 and N28, and an inverter IV25 configured to invert and buffer the control signal CTRL, and the fourth buffer section 24 is configured to invert and buffer the ground voltage VSS when the control signal CTRL is at a logical high level.

An output signal of the third buffer section 23 and an output signal of the fourth buffer section 24 are inverted and buffered by an inverter IV26, and transmitted as the second control pulse DSFP_CTRL.

That is, when the control signal CTRL is at a logical low level, the first pulse DSRP is transmitted as the first control pulse DSRP_CTRL, and the second pulse DSFP is transmitted as the second control pulse DSFP_CTRL. However, when the control signal CTRL is at a logical high level, the ground voltage VSS is transmitted as the first and second control pulses DSRP_CTRL and DSFP_CTRL.

Figure 3A:
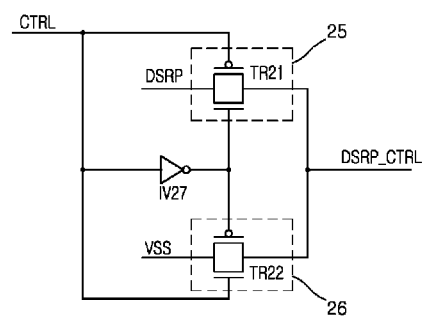
FIGS. 3A and 3B are circuit diagrams illustrating another example of the select transmission unit of FIG. 1.
Figure 3B:
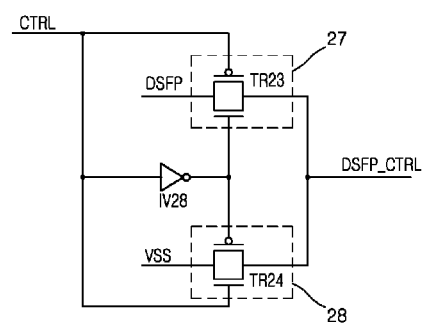

FIGS. 3A and 3B are circuit diagrams illustrating another example of the select transmission unit of FIG. 1.

Referring to FIGS. 3A and 3B, the select transmission unit 2 includes first to fourth transmission sections 25 to 28.

The first transmission section 25 includes a transmission gate TR21, and the first transmission section 25 is configured to transmit the first pulse DSRP as the first control pulse DSRP_CTRL when the control signal CTRL is at a logical low level.

The second transmission section 26 includes a transmission gate TR22, and the second transmission section 26 is configured to transmit the ground voltage VSS as the first control pulse DSRP_CTRL when the control signal CTRL is at a logical high level.

The third transmission section 27 includes a transmission gate TR23, and the third transmission section 27 is configured to transmit the second pulse DSFP as the second control pulse DSFP_CTRL when the control signal CTRL is at a logical low level.

The fourth transmission section 28 includes a transmission gate TR24, and the fourth transmission section 28 is configured to transmit the ground voltage VSS as the second control pulse DSFP_CTRL when the control signal CTRL is at a logical high level.

That is, when the control signal CTRL is at a logical low level, the first pulse DSRP is transmitted as the first control pulse DSRP_CTRL, and the second pulse DSFP is transmitted as the second control pulse DSFP_CTRL. However, when the control signal CTRL is at a logical high level, the ground voltage VSS is transmitted as the first and second control pulses DSRP_CTRL and DSFP_CTRL.

Figure 4:
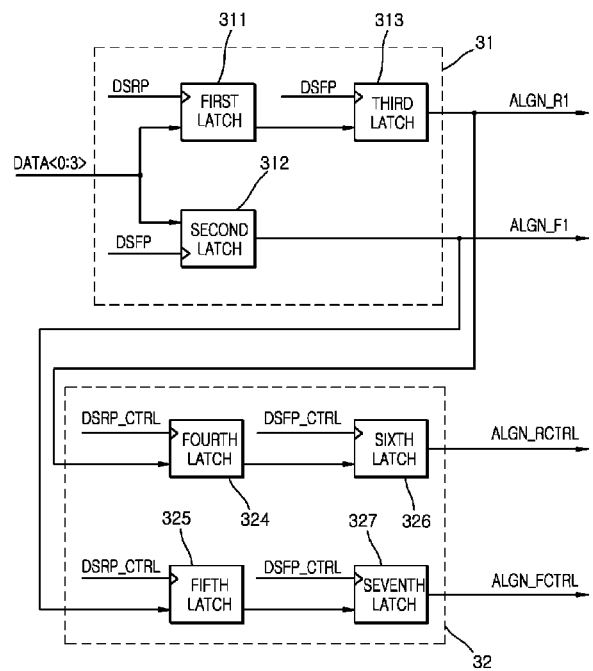
FIG. 4 is a circuit diagram of a data latch unit of FIG. 1.

Referring to FIG. 4, the data latch unit 3 includes a first latch section 31 and a second latch section 32.

The first latch section 31 includes first to third latches 311 to 313. The first latch 311 is configured to latch the data DATA<0:3> in synchronization with the first pulse DSRP. The second latch 312 is configured to latch the data DATA<0:3> in synchronization with the second pulse DSFP and generate second output data ALGN_F1. The third latch 313 is configured to latch an output signal of the first latch 311 and generate first output data ALGN_R1. The first latch section 31 configured in such a manner latches the data DATA<0:3> in response to the first and second pulses DSRP and DSFP, and generates the first and second output data ALGN_R1 and ALGN_F1.

The second latch section 32 includes fourth to seventh latches 324 to 327. The fourth latch 324 is configured to latch the first output data ALGN_R1 in synchronization with the first control pulse DSRP_CTRL. The fifth latch 325 is configured to latch the second output data ALGN_F1 in synchronization with the first control pulse DSRP_CTRL. The sixth latch 326 is configured to latch an output signal of the fourth latch 324 in synchronization with the second control pulse DSFP_CTRL, and generate third output data ALGN_RCTRL. The seventh latch 327 is configured to latch an output signal of the fifth latch 325 in synchronization with the second control pulse DSFP_CTRL, and generate fourth output data ALGN_FCTRL. The second latch section 32 configured in such a manner latches the first and second output data ALGN_R1 and ALGN_F1 in synchronization with the first and second control pulses DSRP_CTRL and DSFP_CTRL, and generates the third and fourth output data ALGN_RCTRL and ALGN_FCTRL.

The operation of the data alignment circuit configured in the above-described manner will be described in detail with reference to FIGS. 1 to 4. The operations may be divided depending on logical levels of the control signal CTRL. That is, an operation is described with the control signal CTRL having a logical low level, and an operation is described with the control signal CTRL having a logical high level.

First, the DDR2 mode in which the data alignment circuit outputs serially-inputted data DATA<0:3> in a parallel form of four bits, that is, a case in which the control signal CTRL is at a logical low level will be described.

When the control signal CTRL is at a logical low level, the select transmission unit 2 transmits the first pulse DSRP as the first control pulse DSRP_CTRL, and transmits the second pulse DSFP as the second control pulse DSFP_CTRL.

The first latch section 31 of the data latch unit 3 latches the data DATA<0:3> in synchronization with the first and second pulses DSRP and DSFP, and generates the first and second output data ALGN_R1 and ALGN_F1.

Furthermore, the second latch section 32 of the data latch unit 3 latches the first and second output data ALGN_R1 and ALGN_F1 in synchronization with the first and second control pulse DSRP_CTRL and DSFP_CTRL, and generates the third and fourth output data ALGN_RCTRL and ALGN_FC-TRL.

In short, when the control signal CTRL is at a logical low level, the first pulse DSRP is transmitted as the first pulse DSRP_CTRL, and the second pulse DSFP is transmitted as the second control pulse DSFP_CTRL. Therefore, the first and second latch sections 31 and 32 of the data latch unit 3 operate to output the data DATA<0:3> in a parallel form of four bits.

Next, the DDR mode in which the data alignment circuit outputs serially-inputted data DATA<0:3> in a parallel form of two bits, that is, a case in which the control signal CTRL is at a logical high level will be described as follows.

When the control signal CTRL is at a logical high level, the select transmission unit 2 transmits the ground voltage VSS as the first and second pulses DSRP_CTRL and DSFP_CTRL.

The first latch section 31 of the data latch unit 3 latches the data DATA<0:3> in synchronization with the first and second pulses DSRP and DSFP, and generates the first and second output data ALGN_R1 and ALGN_F1.

Since the second latch section 32 of the data latch unit 3 is synchronized with the ground voltage, the second latch section 32 cannot latch the first and second output data ALGN_R1 and ALGN_F1.

In short, when the control signal CTRL is at a logical high level, the ground voltage VSS is transmitted as the first and second control pulses DSRP_CTRL and DSFP_CTRL. Therefore, only the first latch section 31 of the data latch unit 3 operates to output the data DATA<0:3> in a parallel form of two bits.

As described above, the data alignment circuit according to the embodiment may align serially-inputted data in a parallel form of two or four bits in response to a control signal.

Embodiments of the present invention have been disclosed above for illustrative purposes only. Those skilled in the art will appreciate that various modifications, additions and substitutions are possible, without departing from the scope and spirit of the invention as disclosed in the accompanying claims.

What is claimed is:

1. A data alignment circuit comprising:
   a first buffer section configured to invert and buffer a first pulse in response to a control signal;
   a second buffer section configured to invert and buffer ground voltage in response to the control signal;
   a first inverter configured to invert and buffer output signals of the first and second buffer sections and transmit the inverted and buffered signals as a first control pulse;
   a third buffer section configured to invert and buffer a second pulse in response to the control signal;
   a fourth buffer section configured to invert and buffer the ground voltage in response to the control signal;
   a second inverter configured to invert and buffer output signals of the third and fourth buffer sections and transmit the inverted and buffered signals as a second control pulse; and
   a data latch unit configured to latch data in response to the first and second pulses and the first and second control pulses, and generate first to fourth data.

2. The data alignment circuit according to claim 1, wherein the first pulse comprises a pulse which is generated in synchronization with a rising edge of a data strobe signal, and the second pulse comprises a pulse which is generated in synchronization with a falling edge of the data strobe signal.

3. The data alignment circuit according to claim 1, wherein the control signal has a first logical level in a first mode and a second logical level in a second mode and the speed of inputting or outputting a data in the first mode is twice as fast as that in the second mode.

4. The data alignment circuit according to claim 3, wherein, when the control signal is at the first logical level, the first buffer section buffers the first pulse and transmits the buffered signal as the first control pulse, and the third buffer section buffers the second pulse and transmits the buffered signal as the second control pulse.

5. The data alignment circuit according to claim 3, wherein, when the control signal is at the second logical level, the second buffer section buffers the ground voltage and transmits the buffered signal as the first control pulse, and the fourth buffer section buffers the ground voltage and transmits the buffered signal as the second control pulse.

6. The data alignment circuit according to claim 1, wherein the data alignment circuit configured to transmit the first and second pulses as the first and second control pulses in a first mode, and transmit the ground voltage as the first and second control pulses in a second mode.

* * * * *